United States Patent

Scheel et al.

(10) Patent No.: US 10,024,937 B2
(45) Date of Patent: Jul. 17, 2018

(54) GRADIENT AMPLIFIER WITH COMPENSATION FOR DEAD TIME AND FORWARD VOLTAGE

(71) Applicant: KONINKLIJKE PHILIPS N.V., Eindhoven (NL)

(72) Inventors: Thomas Scheel, Stolberg (DE); Christian Hattrup, Wurselen (DE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 1148 days.

(21) Appl. No.: 14/345,409

(22) PCT Filed: Sep. 20, 2012

(86) PCT No.: PCT/IB2012/054991
§ 371 (c)(1),
(2) Date: Mar. 18, 2014

(87) PCT Pub. No.: WO2013/046099
PCT Pub. Date: Apr. 4, 2013

(65) Prior Publication Data
US 2014/0354281 A1 Dec. 4, 2014

Related U.S. Application Data

(60) Provisional application No. 61/539,524, filed on Sep. 27, 2011.

(51) Int. Cl.
*G01R 33/387* (2006.01)
*G01R 33/54* (2006.01)
(Continued)

(52) U.S. Cl.
CPC ....... *G01R 33/387* (2013.01); *G01R 33/3852* (2013.01); *G01R 33/543* (2013.01); *G01R 33/56572* (2013.01); *H03F 3/2173* (2013.01)

(58) Field of Classification Search
CPC .......... G01R 33/3852; G01R 33/387; G01R 33/543; G01R 33/56572; H03F 3/2173
(Continued)

(56) References Cited

U.S. PATENT DOCUMENTS 5,273,908 A   12/1993 Sakata
5,451,878 A   9/1995 Wirth
(Continued)

FOREIGN PATENT DOCUMENTS

EP   0367468 B1   12/1995
EP   0987818 A2   3/2000
(Continued)

OTHER PUBLICATIONS

Fukuda, H. et al "State-Vector Feedback Control based High-Frequency Carrier PWM Power Conversion Amplifier with High-Precision Magnetic-Field Current-Tracking Scheme", Electronic Power Supply Systems, Proceedings of the European Conf. on Power Electronics and Applications, Sep. 1993, vol. 3, pp. 11-16.
(Continued)

*Primary Examiner* — Rishi Patel

(57) ABSTRACT

Non-linearities of a gradient amplifier (1) for powering a gradient coil (16) are caused by the finite dead time of the amplifier and/or by a forward voltage drop. The gradient amplifier (1) includes a controllable full bridge (8) and an output filter (9). The full bridge (8) is controlled to provide a desired coil current ($i_c$), including receiving a desired duty cycle ($a_{\mathit{eff}}$) of the gradient amplifier (1), measuring an input current ($i_{\mathit{filt}}$) and an output voltage ($uc_{\mathit{filt}}$) of the output filter (9), evaluating an modulator duty cycle ($a_{mod}$), and providing the modulator duty cycle ($a_{mod}$) for controlling the full bridge (8). The gradient amplifier (1) powers a gradient coil (16) including at least two half bridges (10), each having at least two power switches (11) connected in series. An output (Continued)

filter (9) connected to a tapped center points of the half bridges (10) between two the power switches (11). A controller provides a desired duty cycle ($a_{eff}$) of the gradient amplifier (1), a compensation block (5) for providing an modulator duty cycle ($a_{mod}$). A modulator (6) controls the power switches (11) according to the modulator duty cycle ($a_{mod}$).

11 Claims, 12 Drawing Sheets

(51) Int. Cl.
*G01R 33/565* (2006.01)
*G01R 33/385* (2006.01)
*H03F 3/217* (2006.01)

(58) Field of Classification Search
USPC .................................................. 324/318–322
See application file for complete search history.

(56) References Cited

U.S. PATENT DOCUMENTS

| | | | |
|---|---|---|---|
| 6,166,602 A | 12/2000 | Steigerwald | |
| 6,187,537 B1 | 2/2001 | Zinn | |
| 6,400,158 B1* | 6/2002 | Van Groningen | G01R 33/3852 324/318 |
| 6,429,026 B1 | 8/2002 | Pettersson | |
| 6,605,438 B1 | 8/2003 | Dischler | |
| 7,116,166 B2 | 10/2006 | Sabate | |
| 7,253,625 B2 | 8/2007 | Trabbie | |
| 7,639,015 B2 | 12/2009 | Thuringer | |
| 2003/0175827 A1 | 9/2003 | Stillman | |
| 2004/0018613 A1 | 1/2004 | Shoji | |
| 2005/0112687 A1 | 5/2005 | Remacle | |
| 2006/0208798 A1 | 9/2006 | Labbe | |
| 2006/0223074 A1 | 10/2006 | Bunch | |
| 2007/0273440 A1 | 11/2007 | Wendt | |
| 2009/0088328 A1 | 4/2009 | Mohammed | |
| 2009/0143243 A1 | 6/2009 | Gunning | |
| 2009/0167431 A1 | 7/2009 | Guilherme | |

FOREIGN PATENT DOCUMENTS

| | | |
|---|---|---|
| EP | 1717243 A1 | 11/2006 |
| GB | 2016687 A | 9/1979 |
| WO | 199858259 A1 | 12/1998 |
| WO | 2010109399 A1 | 9/2010 |
| WO | 2011158170 A1 | 12/2011 |

OTHER PUBLICATIONS

Li, Siqi et al "Stacked High/Low Voltage Level H-Bridge Circuit for Gradient Amplifier of MRI System", Electrical Machines and Systems, ICEMS 2008, pp. 2154-2158.

Sepe, Raymond et al "Inverter Nonlinearities and Discrete-Time Vector Current Control", IEEE Transactions on Industry Applications, vol. 30, No. 1 Jan. 1994.

Sabate, Juan et al "Dead-Time Compensation for a High-Fidelity Voltage Fed Inverter", IEEE 2008, pp. 4419-4425.

Polifke, Tobias et al "Eternal Shelf Life for ELISA?, Long Term Stabilization of Assay Components", Candor Bioscience, White Paper, 1997.

\* cited by examiner

GRADIENT AMPLIFIER WITH COMPENSATION FOR DEAD TIME AND FORWARD VOLTAGE

CROSS-REFERENCE TO PRIOR APPLICATIONS

This application is the U.S. National Phase application under 35 U.S.C. § 371 of International Application No. PCT/IB2012/054991, filed on Sep. 20, 2012, which claims the benefit of U.S. Provisional Patent Application No. 61/539,524, filed on Sep. 27, 2011. These applications are hereby incorporated by reference herein.

FIELD OF THE INVENTION

The invention relates to a method for compensating non-linearities of a gradient amplifier for powering a gradient coil comprising a controllable full bridge and an output filter, whereby the full bridge is controlled to provide a desired coil current. The invention further relates to gradient amplifiers for generating the magnetic coil currents according to a duty cycle to provide spatial information in MRI systems comprising a controllable full bridge comprising at least two half bridges, each half bridge having at least two power switches connected in series, whereby each half bridge is tapped at its center point between the switches, and an output filter connected between the tapped center points of the half bridge and the gradient coil, a controller unit for providing a desired duty cycle for the gradient amplifier, and a modulator for controlling the switches according to the duty cycle.

BACKGROUND OF THE INVENTION

Gradient amplifiers generate magnetic coil currents to provide spatial information in MRI systems. State of the art gradient amplifiers use fast switching power devices with analogue control (e.g. PID controller) of the half bridges to provide the desired duty cycle with high accuracy. Such a gradient amplifier is known from U.S. Pat. No. 7,253,625. This solution is very cost-intensive.

There are mainly two effects making the use of cheaper components difficult, since the accuracy of the duty cycle is reduced:

First, the converter for the gradient amplifier consists typically of one or more full bridges, each full bridge being composed of two half bridges. A half bridge is a series connection of two power switches comprising e.g. MOSFETs or IGBTs, and is connected to the mains supply. The output voltage of the half bridge is tapped at the centre point between the power switches. Assuming that the negative rail of the supply is at zero voltage the half bridge can supply a positive voltage, when the upper switch is switched on while the lower switch is switched off, and a zero voltage, when the lower switch is switched on while the upper switch is switched off. In order to avoid a short circuit when a transition from positive to zero voltage or vice versa takes place, a certain waiting time is required after the first switch is switched off before the second switch is switched on. This time is the so-called dead-time. During this dead-time the output voltage is not determined by the switch states but depends on the output current and internal states of the system and parasitics. Thus, there is a certain effective voltage error induced by the dead-time, that can hamper the control performance or at the worst lead to controller instabilities. The required dead time increases with an increasing switching time of the power switches, resulting in an increased effective voltage error.

Second, even when a power switch is switched on, a voltage drop over the terminals of the switch occurs. This voltage drop depends nonlinearly on the switch current and causes also a voltage error that can lead to similar problems as the dead-time. This error is referred to as forward voltage and increases with the switch current.

State of the art methods to compensate for these voltage errors assume a highly inductive load, so that the current changes only very slowly over one PWM period. This provides a simple compensation, as the voltage error is strongly influenced by the current which can be assumed to be nearly constant over one PWM period. However, the load of the gradient amplifier consists typically of an output filter and a gradient coil. The output filter typically is a LC-filter, which reduces interferences and ripple-currents. While the inductance of the gradient coil is very high, the filter inductance is typically low to minimize voltage loss over the filter. This causes highly dynamic load currents for the converter so that even during one PWM period it can have several zero crossings.

SUMMARY OF THE INVENTION

It is an object of the invention to provide a method for compensating non-linearities of a gradient amplifier and such a gradient amplifier for powering a gradient coil, which are suitable for powering a gradient coil with high accuracy at low costs.

In particular, the present invention provides a method for compensating non-linearities of a gradient amplifier for powering a gradient coil, the gradient amplifier comprising a controllable full bridge and an output filter, whereby the full bridge is controlled to provide a desired coil current, comprising the steps of receiving a desired duty cycle of the gradient amplifier, measuring an input current and an output voltage of the output filter, evaluating a modulator duty cycle as a function of the desired duty cycle and the measured input current and the measured output voltage, and providing the modulator duty cycle for controlling the full bridge.

The present invention further provides a gradient amplifier for powering a gradient coil comprising a controllable full bridge comprising at least two half bridges, each half bridge having at least two power switches connected in series, whereby each half bridge is tapped at its center point between the two power switches, and an output filter connected to the tapped center points of the half bridges, a controller unit for providing a desired duty cycle of the gradient amplifier, a compensation block for providing a modulator duty cycle as a compensation of the desired duty cycle according to the above method, and a modulator for controlling the power switches according to the modulator duty cycle provided by the compensation unit.

The present invention also provides a computer-readable medium such as a storage device, a floppy disk, compact disc, CD, digital versatile disc, DVD, Blu-ray disc, or a random access memory, RAM, containing a set of instructions that causes a computer to perform the above method and a computer program product comprising a computer-usable medium including computer-usable program code, wherein the computer-usable program code is adopted to execute the above method.

The present invention further provides a software package for upgrading a gradient amplifier control software to execute the above method.

Basic idea of the invention is to compensate non-linearities based on the filter voltage and the filter current as input variables to achieve a reliable compensation and to power the gradient coil with high accuracy according to the desired duty cycle. Accordingly, also the desired duty cycle is used as an input variable for providing the duty cycle for the modulator, i.e. the modulator duty cycle. The high accuracy of the compensation allows the use of cheap switching component, i.e. cheap power switches to reduce the overall costs of the gradient amplifier and the overall MRI system. Preferably, the compensation block is a digital compensation block, which enables an efficient processing of the input variables. Approximations based on the assumption of constant currents over a PWM period are not required, which increases the accuracy of the gradient coil currents compared to the controller value. Highly dynamic load currents can be dealt with high accuracy and undefined states, e.g. due to switching times of the power switches or forward voltages, do not lead to applied duty cycles different from the desired duty cycles, since the filter current and voltage are evaluated and considered for the modulator duty cycle.

A preferred embodiment comprises the step of generating a three-dimensional look-up table, which provides the modulator duty cycle as a function of the desired duty cycle, the input current and the output voltage, whereby the step of evaluating the modulator duty cycle comprises performing a look-up in the lookup-table. With the look-up table, the value of the modulator duty cycle can be obtained without time-consuming calculations based on individual supporting points of the look-up table. The look-up table only has to be provided once, so that the compensation block requires only low computational power for providing the effective duty cycle. Preferably, the look-up table is generated out of the compensation block, e.g. by any kind of calculation device, and is transferred to the compensation block before starting the compensation. Accordingly, the look-up table can also be replaced in case an improved table is available or components, particularly power switches, with different characteristics are used in the gradient amplifier.

A preferred embodiment comprises the step of generating an inverted three-dimensional look-up table, which provides the desired duty cycle as a function of the modulator duty cycle, the input current and the output voltage, whereby the step of evaluating the modulator duty cycle comprises performing a look-up of the desired duty cycle in the lookup-table and determining the modulator duty cycle from the desired duty cycle according to an inversion method. The function $a_{mod}$ depending on the desired duty cycle, the filter voltage, and the filter current usually contains a slope, which makes it difficult to provide a suitable value the for the modulator duty cycle and requires a huge number of supports, especially in the area of the slope. Provisioning the inverted look-up table increases calculation time for calculating the compensation value. Nevertheless, since the function $a_{eff}$ depending on the modulator duty cycle, the filter voltage, and the filter current does not contain discontinuities or steep slopes, the number of required supporting points is reduced, so that the compensation block requires only a small amount of memory for storing the look-up table. This allows keeping the costs for the compensation block low.

In a preferred embodiment the step of determining the modulator duty cycle from the desired duty cycle according to the look-up table comprises approximating of the modulator duty cycle using the bisection method. The bisection method has a guaranteed convergence and the accuracy of the solution does not depend on the type of function. The run-time of the algorithm for the bisection method is very predictable, which makes the bisection method suitable for implementation in a digital control environment.

In a preferred embodiment the step of evaluating the modulator duty cycle comprises performing an interpolation between supporting points of the look-up table. The interpolation allows providing the modulator duty cycle with increased accuracy without increasing the number of required supporting points. Preferably, a linear interpolation is performed, which can be easily applied and requires only simple calculations.

In a preferred embodiment the step of generating a three-dimensional look-up table comprises generating supporting points, which have a mixed logarithmically/linear distribution. Accordingly, the number of support points can be reduced to allow an efficient memory usage of the compensation block. The distribution of the supporting points is preferably chosen to provide a high number of supporting points in an area of special interest, e.g. a center area or an area containing a slope, and a lower number of supporting points in other areas.

In a preferred embodiment the step of generating supporting points, which have a mixed logarithmically/linear distribution comprises generating a set of supporting points for positive values with a number of n logarithmically distributed main divisions and a number of m linear subdivisions between each main division, and the step of performing a look-up in the lookup-table comprises determining an index value of the element in the look-up table by determining a logarithmic offset by evaluating the position of the most significant bit of the value to be looked-up and multiplying it by $2^m$, taking the value of the set of m bits following the most significant bit as linear offset, and providing the sum of the logarithmic offset and the linear offset as index value. Accordingly, the size of subsequent main divisions usually increases and the space between the main divisions is equally distributed by the subdivisions, resulting in a linear distribution of the subdivisions. For this embodiment, the first two main divisions, i.e. between zero and two, have the highest density of supporting points. This distribution of supporting points allows a simple look-up of values in the look-up table, which is done by only few simple and quick bit evaluation and extraction operations.

In a preferred embodiment the step of generating supporting points, which have a mixed logarithmically/linear distribution comprises generating a set of supporting points equally distributed around zero with a number of n logarithmically distributed main divisions and a number of m linear subdivisions between each main division, and the step of performing a look-up in the lookup-table comprises determining an index value of the element in the look-up table by forming the absolute value of value to be looked-up determining a logarithmic offset by evaluating the position of the most significant bit of the absolute value and multiplying it by $2^m$, taking the value of the set of m bits following the most significant bit as linear offset, and in case the value to be looked-up being a negative value, providing the half number of elements of the look-up table reduced by the sum of the logarithmic offset and the linear offset as index value, and otherwise providing the sum of the half number of elements of the look-up table, the logarithmic offset and the linear offset as index value. Also in this embodiment the size of subsequent main divisions usually increases and the space between the main divisions is equally distributed by the subdivisions, resulting in a linear distribution of the subdivisions. For these supporting points, the area around zero has the highest density of supporting points, whereby the density decreases with an increasing distance from zero. This distribution of supporting points allows a simple look-up of values in the look-up table, which is done by only few simple and quick bit evaluation and extraction operations.

In a preferred embodiment the step of performing an interpolation between the supporting points of the look-up table comprises performing a linear interpolation, whereby a remainder following the set of m bits following the most significant bit defines the position of the value to be looked-up between adjacent supporting points. Accordingly, calculations usually required for linear approximation to determine the position of a value between two supporting points, e.g. the calculation of $(x-x_1)(x_2-x_1)$, where x refers to the position to be looked-up and $x_1$ and $x_2$ to the positions of the closest supporting points, can be omitted by simple taking the specified bits of the value to be looked-up.

In a preferred embodiment the step of generating a three-dimensional look-up table comprises determining supporting points of the look-up table by simulation or by mathematical calculation. This allows providing the look-up table based on time consuming and more accurate simulation or mathematical calculation to enable provisioning of modulator duty cycles with high accuracy in short time. Simulation or mathematical calculation only has to be performed once for any configuration of the gradient amplifier, particularly for any set of used switches, which is an efficient way to provide high accuracy data for the look-up table.

In a preferred embodiment the power switch comprises a power transistor, e.g. a MOSFET or an IGBT, and a (intrinsic) diode, which are connected in parallel. The diode is used in a state, where a half-bridge is inactive and both power transistors are open, so that currents through the inductors can continue flowing through the full bridge.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

BRIEF DESCRIPTION OF THE DRAWINGS

These and other aspects of the invention will be apparent from and elucidated with reference to the embodiments described hereinafter.

In the drawings.

DETAILED DESCRIPTION OF EMBODIMENTS

Figure 1:
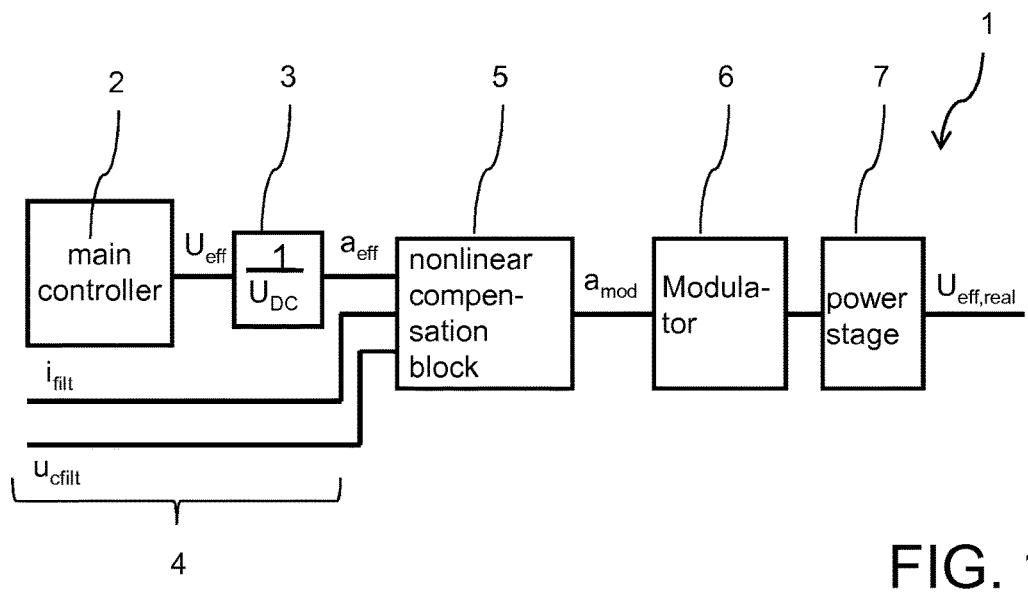
FIG. 1 shows a schematical view of a gradient amplifier according to an embodiment of the invention.

FIG. 1 shows a schematical view 1 of a gradient amplifier according to an embodiment of the invention. The gradient amplifier 1 comprises a main current controller 2, which provides a requested voltage $U_{eff}$ that corresponds to an averaged converter voltage over one PWM cycle.

The gradient amplifier 1 further comprises a duty cycle calculation unit 3, which provides a desired duty cycle $a_{eff}$, also referred to as effective duty cycle $a_{eff}$, by dividing $U_{eff}$ by the overall DC bus voltage. Hence, $a_{eff}$ corresponds to the duty cycle that is requested by the main controller 2. The main controller 2 and the duty cycle calculation unit 3 form a controller unit 4, which provides as output the desired duty cycle $a_{eff}$.

The gradient amplifier 1 further comprises a compensation block 5 for providing a modulator duty cycle $a_{mod}$, which is a duty cycle containing a compensation of nonlinearities of the gradient amplifier 1. The compensation block 4 receives as input values the effective duty cycle $a_{eff}$, a measured filter current $i_{filt}$ and a measured filter voltage $u_{cfilt}$, and provides the modulator duty cycle $a_{mod}$ by means of a look-up table and interpolation, which will be described later in detail.

Figure 2:
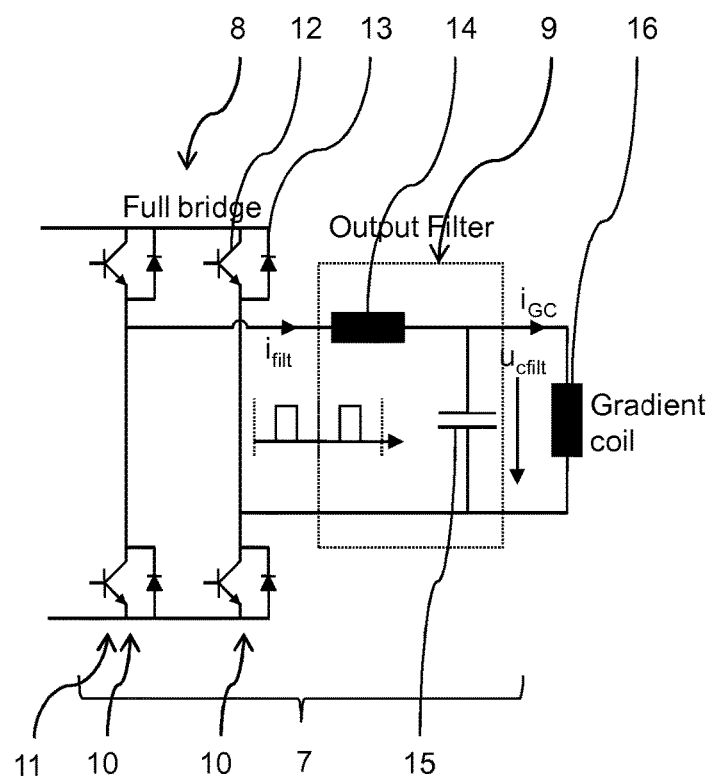
FIG. 2 shows details of the power stage of the gradient amplifier of FIG. 1 with a gradient coil connected to the power stage.

The gradient amplifier 1 further comprises a modulator 6 and a power stage 7, whereby the modulator 6 controls the power stage 7. The power stage, which is best seen in FIG. 2, comprises a controllable full bridge 8 and an output filter 9. The full bridge 8 in this embodiment comprises two half-bridges 10, each of which comprising two switches 11 with a power transistor 12 and a diode 13, which is a power diode in this embodiment and maybe the intrinsic diode of this device. The power transistor 12 in this embodiment is an IGBT, and the power diode 13 is connected in parallel to the collector-emitter path of the power transistor 12, whereby for each power switch 11 the collector-emitter path of the power transistor 12 has the same direction as the reverse direction of the power diode 13. In detail, the full bridge 8 is controlled by the modulator 6 by controlling the power transistors 12, whereby the modulator 6 uses a Pulse Width Modulation (PWM). Each half-bridge 10 is tapped at its center point between the power switches 11 and connected to the output filter 9.

The output filter 9 is a LC-filter comprising at least an inductance 14 and a capacitance 15 for reducing interferences and ripple-currents. The filter inductance is typically low to minimize voltage loss over the output filter 9.

The output filter 9 is electrically connected to a gradient coil 16. The gradient coil 16 generates a magnetic field depending on a gradient coil current $i_{GC}$ for providing spatial information in an MRI-system, which is in its entirety not shown in the figures.

In operation, the control unit 4 provides a desired duty cycle $a_{eff}$ to the compensation block 5. The compensation block 5 is further connected to receive measurements of the filter current $i_{filt}$ and filter voltage $u_{cfilt}$ of the output filter 9. The compensation block 5 comprises a three-dimensional look-up table for evaluating a modulator duty cycle $a_{mod}$ from the provided input values and applying multidimensional linear interpolation. In this embodiment of the invention, the look-up table has the modulator duty cycle $a_{mod}$ as output value and the desired duty cycle $a_{eff}$, the filter current $i_{filt}$, filter voltage $u_{cfilt}$ as input values. The look-up table is calculated according to any of the examples given below.

Figure 15:
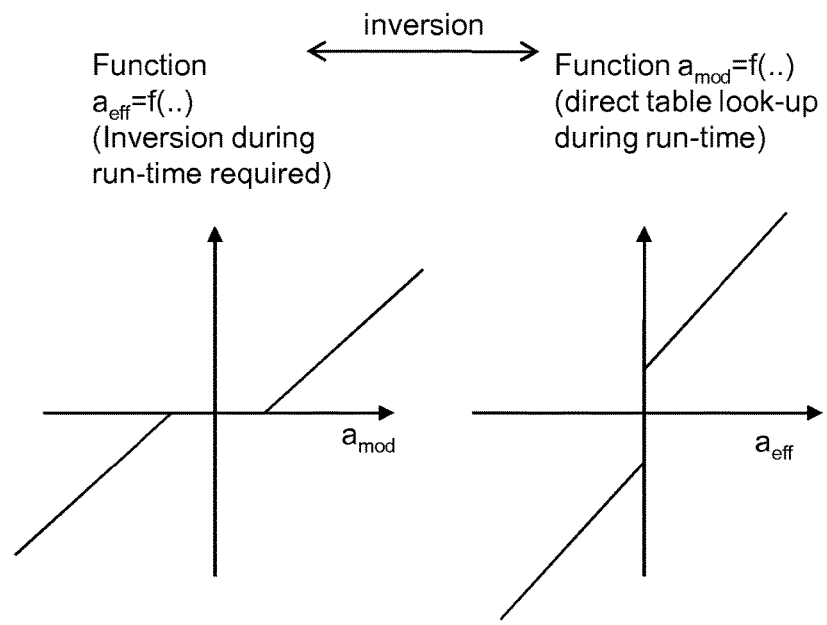
FIG. 15 shows table functions for the desired duty cycle as function of the modulator duty cycle and the inverted function for the modulator duty cycle as function of the desired duty cycle.
Figure 16:
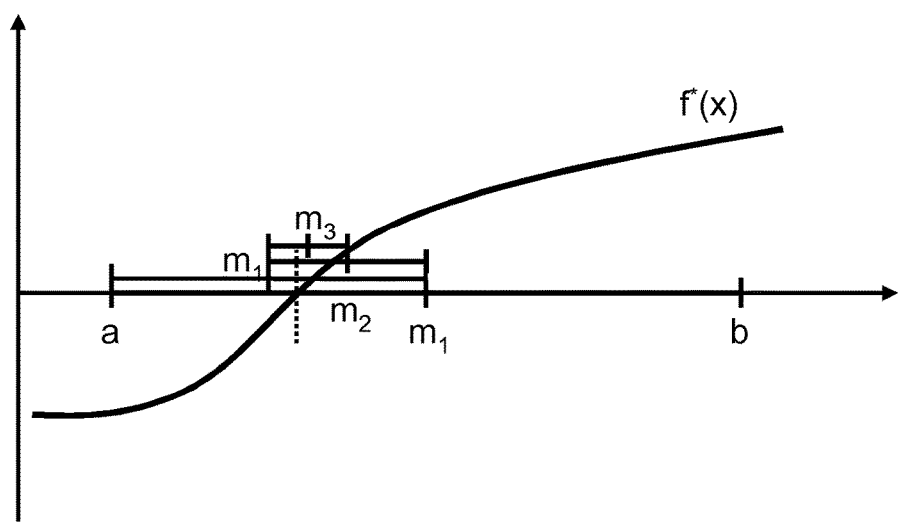
FIG. 16 shows an illustration of the bisection method.

FIG. 15 shows that the compensation function $a_{mod}=f(a_{eff}, i_{filt}, u_{cfilt})$ has steep slopes, so that a high number of supporting points is required to achieve sufficient accuracy. Thus, in order to reduce the number of required data points, in an alternative embodiment, the look-up table is inverted and has the desired duty cycle $a_{eff}$ as output value and the modulator duty cycle $a_{mod}$, the filter current $i_{filt}$, filter voltage $u_{cfilt}$ as input values with the compensation function $a_{eff}=f(a_{mod}, i_{filt}, u_{cfilt})$. In this case, a bisectional approximation of the modulator duty cycle $a_{mod}$ is performed, as shown in FIG. 16. Particularly, the determination of the required $a_{mod}$ for a given $a_{eff}$ is done by root determination with the bisection method. The function, of which the root $a_{mod0}$ has to be determined is the function $f^* = a_{eff}(a_{mod}, i_{filt}, u_{cfilt}) - a_{eff0}$, where $a_{eff0}$ is the value for which the $a_{mod}$ has to be found. According to the bisectional method, one starts with a known interval [a=−1, b=1] that comprises the value of $a_{mod}$. Now, the center point $m_1$ of this interval is determined. If $f^*(m_1)$ and $f^*(a)$ have opposite sign, the root is in between a and $m_1$. If this is not the case, the root is in between $m_1$ and b. Now, this step is repeated with this new interval and the determination of the new center point $m_2$. During each iteration step, the width of the interval is reduced by a factor of 2. The method has guaranteed convergence, and the accuracy of the solution does not depend on the type of function. The run-time of the algorithm is very predictable, which is advantageous for the realization in a digital control environment.

Figure 9:
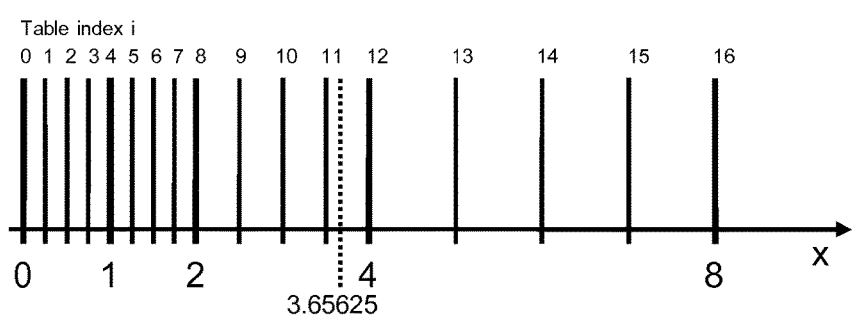
FIG. 9 shows a graph of a combined logarithmic/linear distribution of supporting points on a positive axis with an exemplary look-up value.

In order to reduce the number of required supporting points of the three-dimensional look-up table, a mixed logarithmic/linear distribution of the supporting points is chosen in this embodiment. Such a distribution for positive values is shown in FIG. 9. There are n logarithmically (base of 2) distributed main divisions and $2^m$ linear sub-divisions in between. FIG. 9 illustrates this kind of distribution with n=4 and m=2. The advantage of such a distribution is, that the table indices i for a given value x can be determined very fast and easy from the binary value of x. The table index resulting from the logarithmic ticks is simply given by the position of the most significant 1-bit multiplied with the number $2^m$ of linear divisions. If all bits of the integer part are 0, the offset is also 0. The next m=2 bits that follow the most significant 1 bit (this extends also to the fractional part) determine the index offset given by the linear division. If the integer part is 0, the first two bits of the fractional part determine the "linear" table offset. The "linear" offset has to be added to the "logarithmic" offset to obtain the overall table index. The bits following the linear offset determine directly the fractional part (0-1) between the table index value and its successor according to $(x-x_1)/(x_2-x_1)$. Accordingly, this value can be used directly for the linear interpolation, so that there is no division necessary for the interpolation guaranteeing fast execution in the digital control system, as described in detail below.

Figure 10:
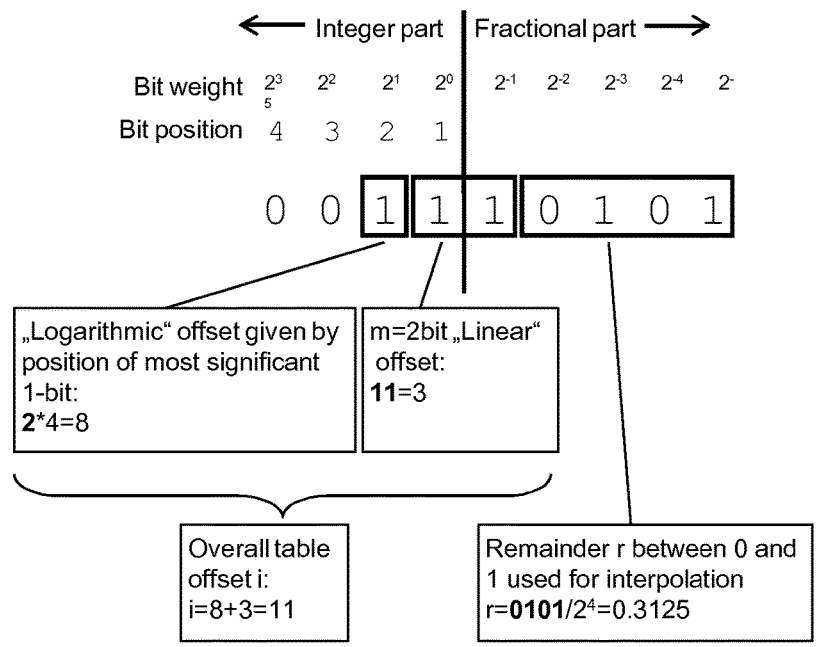
FIG. 10 shows a determination of the look-up table index based on the combined logarithmic/linear distribution of supporting points and the exemplary look-up value according to FIG. 9.

FIG. 10 illustrates the determination of the table index for an example value of x=3.65625. The table values resulting from this evaluation are the values 11 and 12. The reminder of 0.3125 is used directly for the interpolation.

Figure 11:
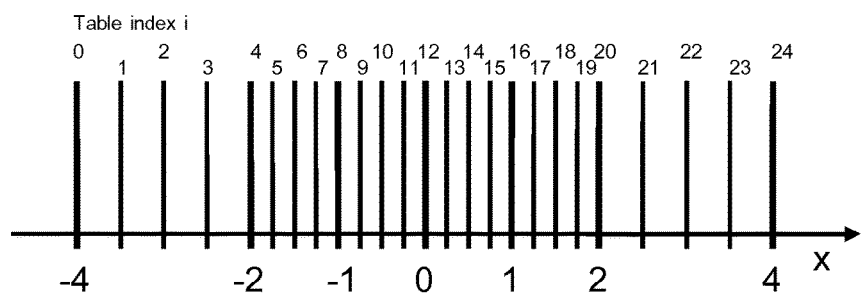
FIG. 11 shows a graph of a combined logarithmic/linear distribution of supporting points on an axis covering positive and negative look-up values.
Figure 12:
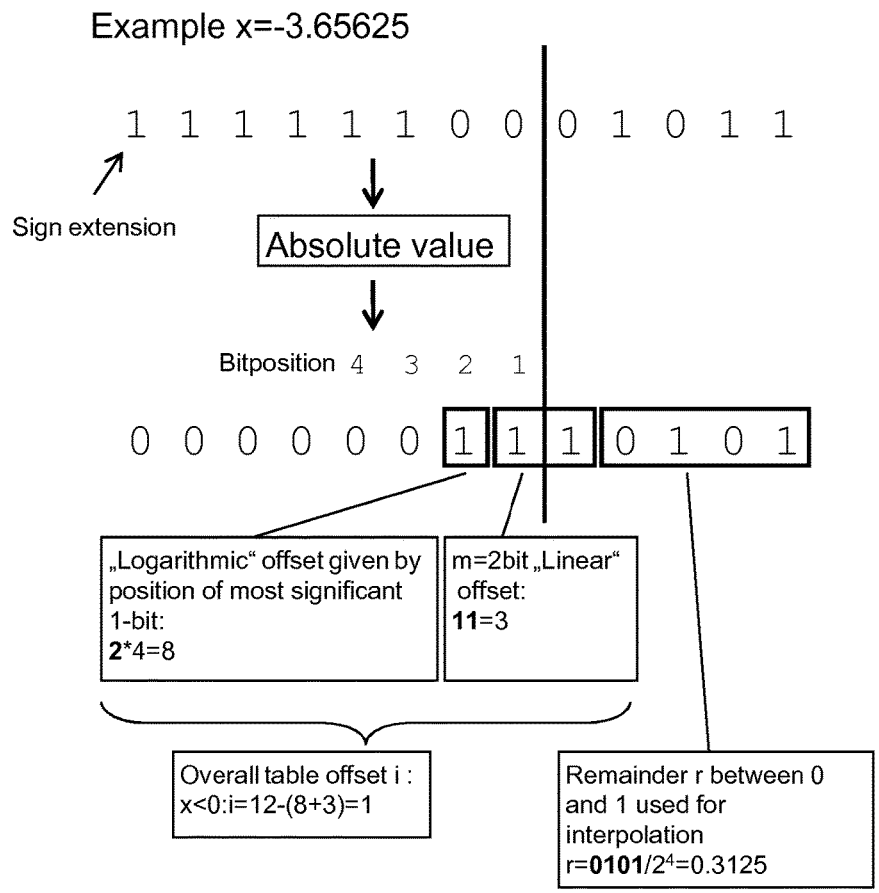
FIG. 12 shows a determination of the look-up table index based on the combined logarithmic/linear distribution of supporting points according to FIG. 11 for a negative exemplary look-up value.

The look-up table should also cover negative and positive values with a logarithmic distribution around zero. This is because the major nonlinearities of the hardware system are centered around zero. Thus, a distribution of the supporting points can be chosen as depicted in FIG. 11. The determination of the table indices can be done as shown in FIG. 12. At first the absolute value of the x-value is determined and then the table index is determined as described above with reference to a table containing only positive values. For positive x the overall table index is 12 plus this table index, for negative x the overall table index is 12 minus this table index.

Figure 13:
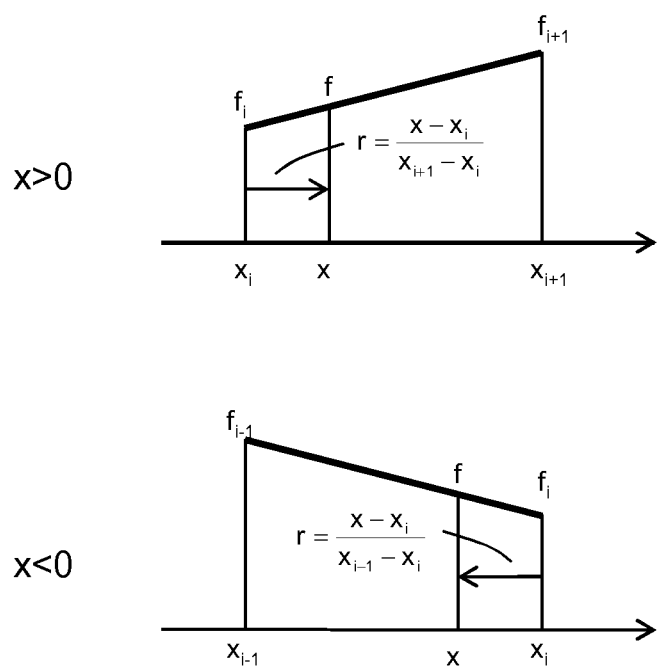
FIG. 13 shows a general interpolation for positive and negative values.

The interpolation between the table values is slightly different for positive and negative x-values, as shown in FIG. 13. For positive x the index i resulting from the above algorithm denotes the supporting point that is smaller than the value x itself. That means the supporting point i+1 is larger than x. For x<0 the situation is reversed. The index i denotes the supporting point that is larger than x, the supporting point i−1 is smaller. In both cases a remainder of zero corresponds to the table index i itself The overall one-dimensional interpolation algorithm itself is now given by:

$$x = x_{in}/x_{max} * 2^{n-1}$$

$$x_{abs} = abs(x)$$

$i_{log}$=max(bitposition of leftmost 1 bit in $x_{abs}$, 0)
$i_{log} \geq 1$: $i_{lin}$=binary number given by m bits in $x_{abs}$ after leftmost 1 bit
$i_{log}$=0: $i_{lin}$=binary number given by first m bits in $x_{abs}$ of fractional part $$x \geq 0: i = n2^m + i_{log} 2^m + i_{lin}$$

$$x < 0: i = n2^m - i_{log} 2^m + i_{lin}$$

r=all remaining bits after linear bits in $x_{abs}$ (fractional part 0-1)

$$x \geq 0: f = f_i + r(f_{i+1} - f_i)$$

$$x < 0: f = f_i + r(f_{i-1} - f_i)$$

Figure 14:
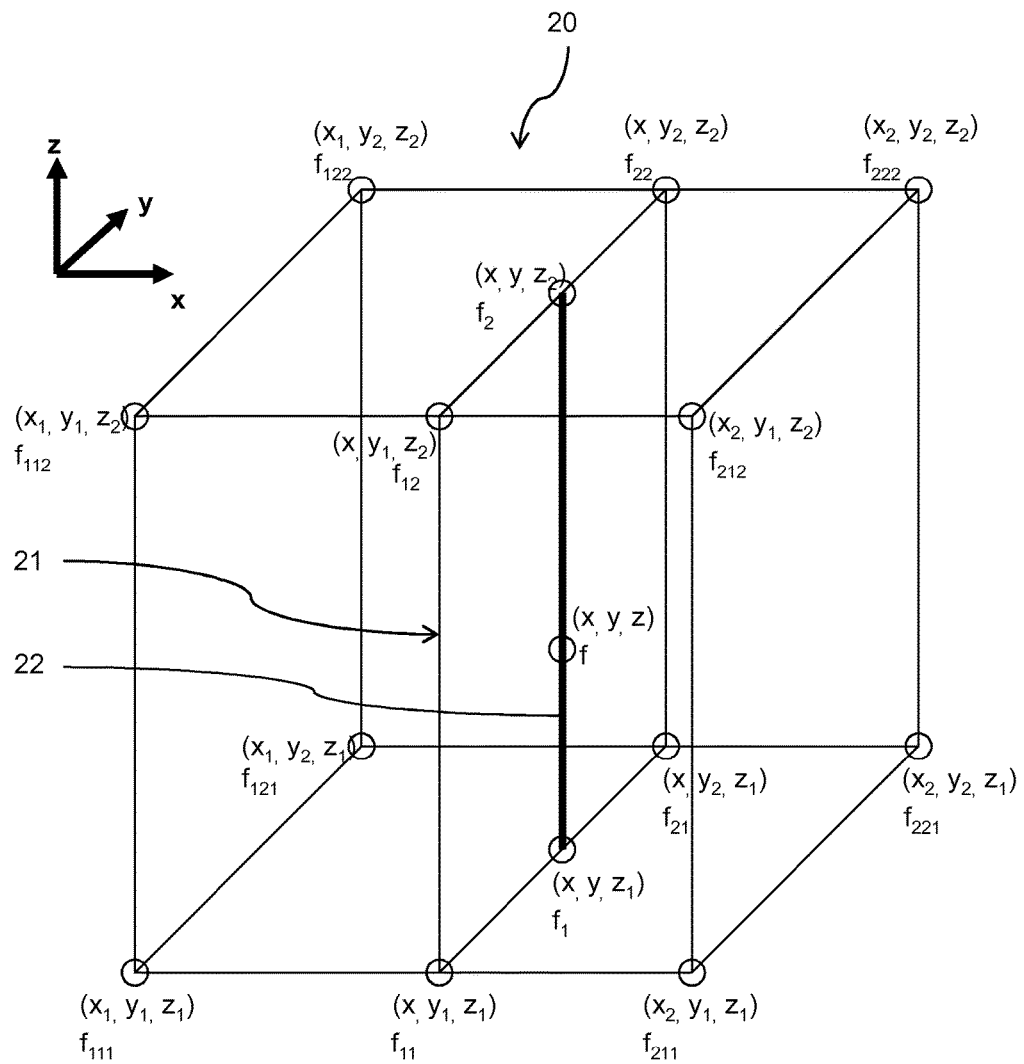
FIG. 14 shows a general three-dimensional multi-linear interpolation.

By the above described one-dimensional determination of the table indices, the 8 vertices of a cube can be determined containing the point x, y, z, where the function value has to be calculated. FIG. 14 illustrates the three-dimensional interpolation method as described below.

The eight vertices $(x_{1/2}, y_{1/2}, z_{1/2})$ are the corners of a cube 20. The corresponding function values $f_{i,j,k}$ are stored in the table. In a first step, four one-dimensional interpolations on the cube edges are executed according to one of the three axis. From this the function values $f_{ij}$ at the four corners of the intermediate plain 21, thus formed by the points $f_{11}$, $f_{21}$, $f_{12}$ and $f_{22}$, will follow. The x-value of this plain 21 is already identical to the x-value of the data point (x,y,z). The dimension of the remaining interpolation task is two, meaning that it is reduced by 1.

In a second step, two more one-dimensional interpolations are executed on the edges of the plain 21. From this function values $f_i$ at the two end-points of line 22 are determined. The x- and y-values of the line 22 are already identical to the x- and y-values of the data point (x,y,z). The dimension of the remaining interpolation task is further reduced to one.

In a last step, a single one-dimensional interpolation on the line 22 is executed, that determines the function value f at the given point (x,y,z).

All in all seven 1-dimensional interpolations have to be executed for the 3-dimensional multi-linear interpolation. These are:

$$f_{11} = f_{111} + f_{211} \frac{x - x_1}{x_2 - x_1}$$

$$f_{12} = f_{112} + f_{212} \frac{x - x_1}{x_2 - x_1}$$

$$f_{21} = f_{121} + f_{221} \frac{x - x_1}{x_2 - x_1}$$

$$f_{22} = f_{122} + f_{222} \frac{x - x_1}{x_2 - x_1}$$

$$f_1 = f_{11} + f_{21} \frac{y - y_1}{y_2 - y_1}$$

$$f_2 = f_{12} + f_{22} \frac{y - y_1}{y_2 - y_1}$$

$$f = f_1 + f_2 \frac{z - z_1}{z_2 - z_1}$$

As already mentioned above, the interpolation factors $(x-x_1)(x_2-x_1)$, $(y-y_1)(y_2-y_1)$, $(z-z_1)(z_2-z_1)$ need not to be calculated! They already result from the table index determination and are identical to the remainder r in FIG. 12. Thus, no time consuming division is required.

Below a first example for determining table values for the look-up table used in the compensation block 5 by means of mathematical calculation will be explained.

Figure 3:
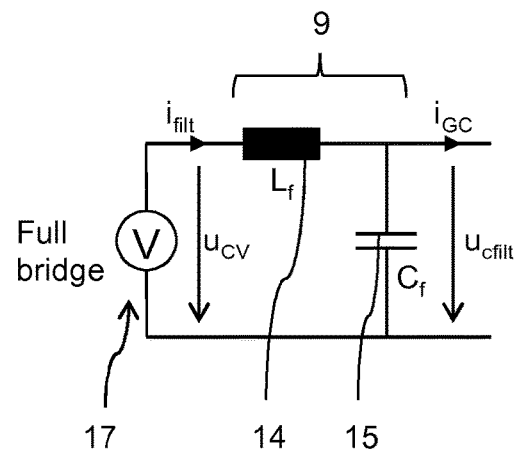
FIG. 3 shows an equivalent circuit of the full bridge with the output filter of FIG. 2.

FIG. 3 shows an equivalent circuit for the power stage 7 comprising a voltage source 17 representing the full bridge 8 as well as inductance 14 and capacitance 15 of the output filter 9. The load current of the output filter 9 is the gradient current that is assumed to be constant over one PWM period. The voltage applied to the output filter 9 is the output voltage of the full bridge 8 which is the difference of the voltages of the two half-bridges 10.

Figure 4:
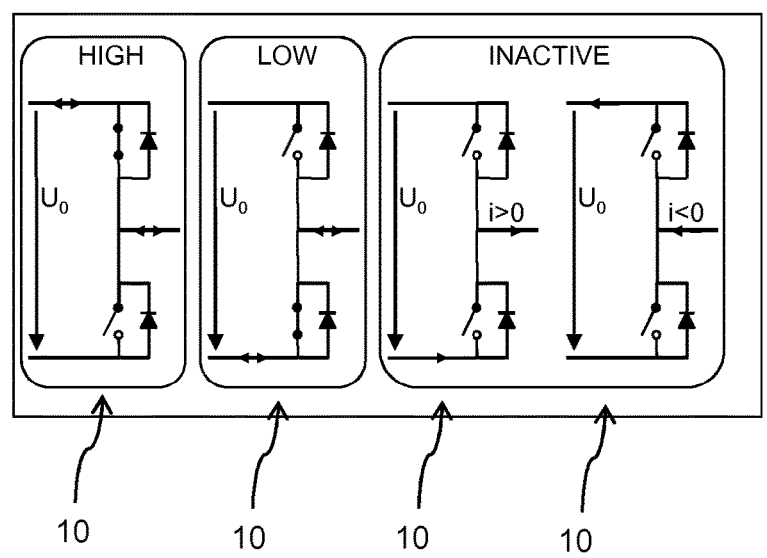
FIG. 4 shows a half-bridge of the full bridge of FIG. 2 in different operation states with the respective currents in these operation states.
Figure 5:
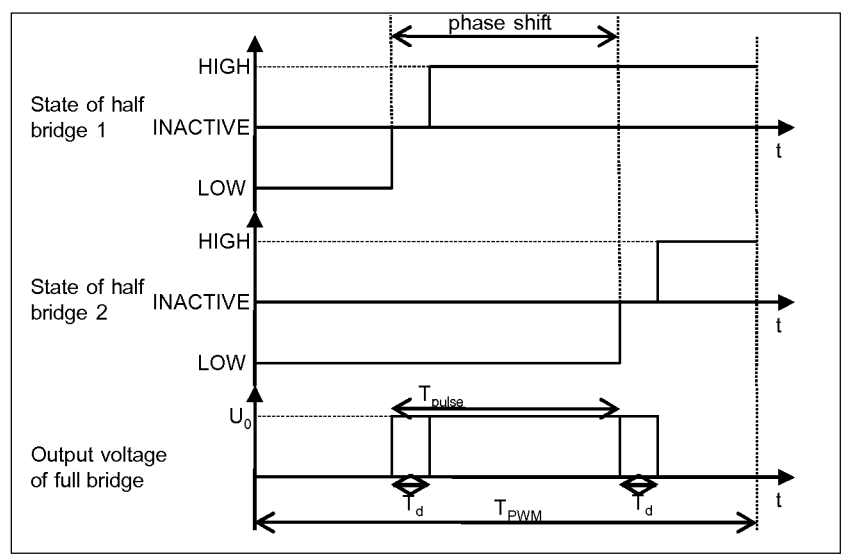
FIG. 5 shows a timing diagram illustrating output voltages of the full bridge of FIG. 2.

The half-bridges 10 are controlled by the modulator 6 according to the phase shift modulation method to generate a PWM signal. FIG. 5 depicts the control signals (HIGH, LOW, INACTIVE) for the two half-bridges 10 and the resulting full bridge output voltage. Accordingly, each half-bridge 10 has three different operational states high, low or inactive, as shown in FIG. 4. In the high-state the upper power switch 11 is on, while the lower power switch 11 is off. Thus, the output of the half-bridge is connected to the positive rail of supply voltage $U_0$. In low-state the lower power switch 11 is on, while the upper power switch 11 is off. Thus, the output of the half-bridge 10 is connected to the negative rail of $U_0$. During the dead-time the half-bridge is in inactive-state, which means that both power switch 11 are off. In this case, the current is flowing through the antiparallel power diodes 13, which means that the output voltage depends on the sign of the filter current $i_{filt}$. For a filter current $i_{filt}$ flowing out of the half-bridge 10, the output is connected to the negative rail of $U_0$ via the respective power diode 11 of the half-bridge 10, while for a filter current $i_{filt}$ flowing into the half-bridge 10, the output is connected to the positive rail of $U_0$, respectively. The pulse time is chosen to be $T_{pulse} = a_{mod} T_{PWM}$. If no dead-time $T_D$ would be present and the forward voltage would be zero, this would lead to an effective output voltage of $a_{mod} * U_0$, thus no compensation would be required as $a_{mod}$ is equal to $a_{eff}$. However, the dead time $T_D$ introduces an effective voltage error and makes $a_{eff}$ unequal to $a_{mod}$, since the filter current $i_{filt}$ can vary, thus compensation is required.

Figure 6:
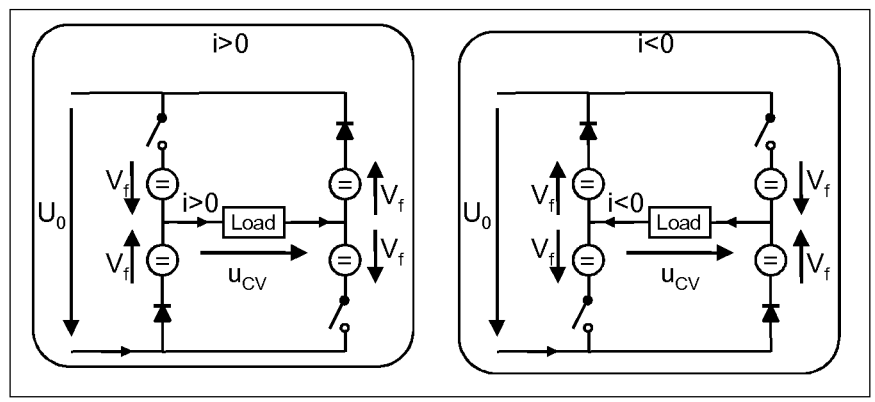
FIG. 6 shows an equivalent circuit for forward voltages of the full bridge of FIG. 2.

Additionally to the described nonlinear effect caused by the dead-time, there is also the nonlinear effect that is caused by the forward voltages of the power switches 11, i.e. the power transistor 12 and a power diode 13. Two equivalent circuits for this situation, one for positive and one for negative load currents i, are shown in FIG. 6. It is furthermore for simplification of the analytical calculation assumed that all power transistors 12 and power diodes 13 have the same forward voltage $V_f$, which has a value that is only dependent on the sign of the load current. From these equivalent circuits the output voltages $u_{CV}$ for all possible switch signals can be deduced. There are always two power transistors 12/power diodes 13 in the voltage path for all configurations, one from the left half-bridge 10 and one from the right half-bridge 10. Thus, it is $$u_{CV} = \begin{Bmatrix} +U_0 \\ 0 \\ -U_0 \end{Bmatrix} - 2V_f \text{ for } i > 0,$$

$$u_{CV} = \begin{Bmatrix} +U_0 \\ 0 \\ -U_0 \end{Bmatrix} + 2V_f \text{ for } i < 0$$

So the output voltage is decreased by $2V_f$ for positive current and increased by $2V_f$ for negative current leading to a certain voltage error depending on the sign of the current (averaged over one PWM period). This is true for arbitrary switch signals.

Figure 7:
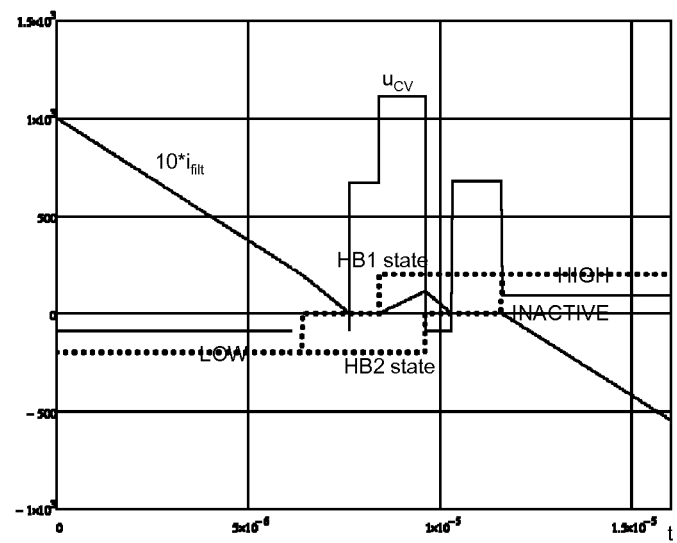
FIG. 7 shows a timing diagram of the output diagram of the full bridge obtained by analytic calculations.

With the assumptions above the waveforms for the filter current $i_{filt}$, the filter voltage $u_{cfilt}$ and the output voltage of the full bridge 8 can be now be calculated by evaluating the differential equations for the system shown in FIG. 3, when knowing the states $i_{filt}$, $u_{cfilt}$, $i_{GC}$ at the start of the PWM cycle and the duty cycle $a_{mod}$ for this PWM cycle. Some approximations have been made that reduce the computational effort for the solution of the differential equation. These are in particular that $i_{GC}$ is assumed to be constant over one PWM period and $u_{cfilt}$ is assumed to be constant during subsequent zero crossings of the filter current $i_{filt}$. FIG. 7 shows an exemplary result with $a_{mod}=0.2$, $i_{filt,0}=100$ A, $u_{cfilt,0}=500V$, $i_{GC}=0$ A for such an analytic evaluation. The effective output voltage can simply be calculated by determining the average voltage of the full bridge output voltage $u_{CV}$. Such a calculation has to be done for every supporting point of the three dimensional table to generate the whole compensation data. To limit the number of input values for the table to three, the value $i_{GC}$ will not be an individual input to the table but will be set to $i_{GC,0}$. This equalization is a good approximation, especially for stationary currents. The resulting $a_{eff}$ as a function of $a_{mod}$ can either be stored directly in the table, or the inverse function amod=$f(a_{eff})$ can be calculated offline and stored in the table. In the latter case, the table data can be used directly for compensation, in the first case the inversion has to be done on-line in the control system hardware before it can be used for compensation (see below). The advantage of doing the inversion off-line is a faster execution, while doing the inversion on-line results in a smaller compensation table and saves memory of the compensation block 6.

Below will be explained a second example for determining table values for the look-up table used in the compensation block 5 by use of a time domain simulation software.

Figure 8:
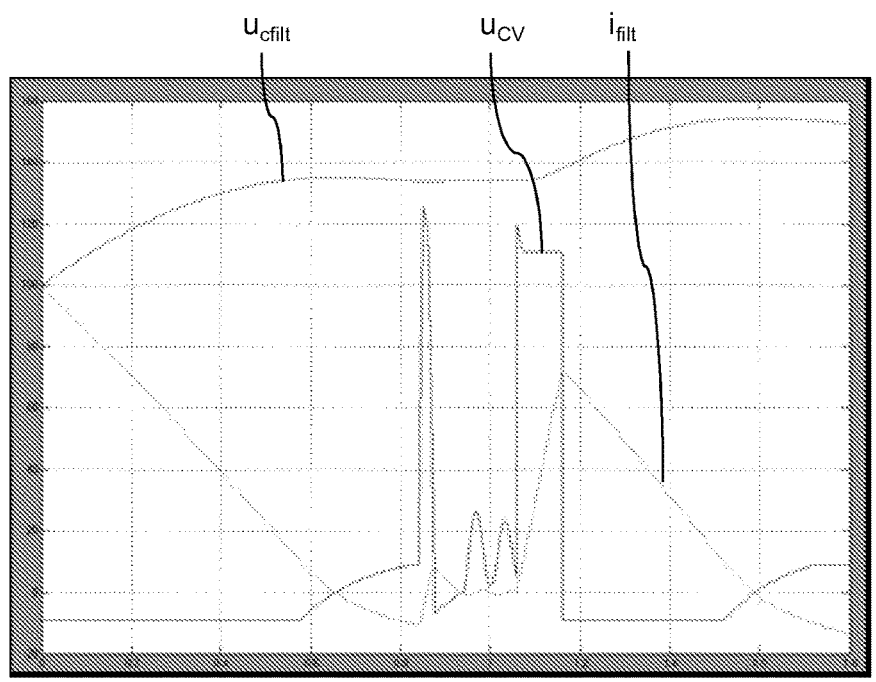
FIG. 8 shows a timing diagram of the output diagram of the full bridge obtained by simulation in time domain.

The time domain simulation software (e.g. SIMULINK) is used to solve differential equations instead of using analytic calculations to determine the average converter output voltage for each set of parameters ($a_{mod}$, $i_{filt}$, $u_{cfilt}$), as described above. FIG. 8 depicts a time domain simulation of one PWM cycle. The advantage is that the simulation model can be more detailed and thus be more precise than an analytical model. For example parasitic node capacitances at the output of the half-bridges 10 have a big impact on the converter output voltage and can be considered easily. Also the forward voltages of the power transistors 12/power diodes 13 can have a nonlinear dependency on the magnitude of the current. The price for this is a higher computation time for the table data. However, as the tables are determined offline, this is mostly irrelevant. Also for the simulative analysis it can be chosen to execute the function inversion off-line or on-line in the control system hardware.

Figure 19:
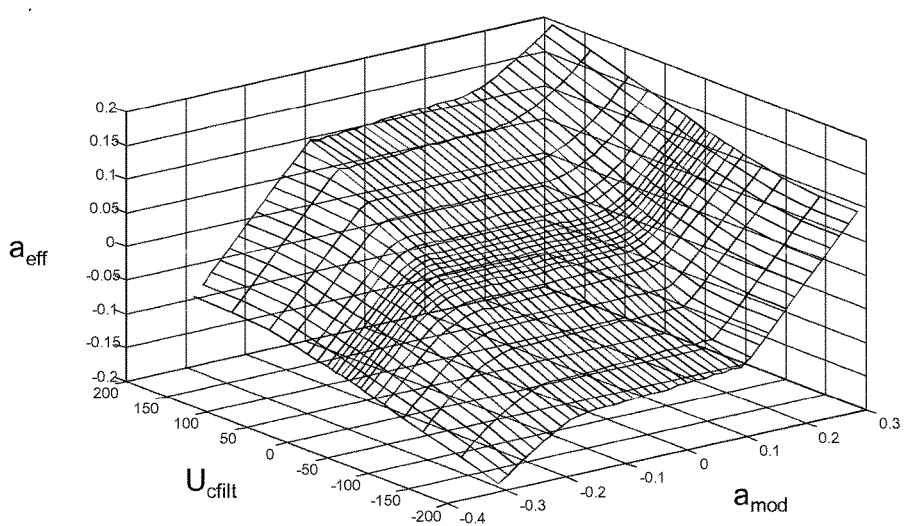
FIG. 19 shows a three-dimensional diagram of an exemplary compensation table for the filter current equal to zero.

FIG. 19 shows a 3D-visualization of the three-dimensional look-up table for compensation of the non-linearities of the gradient amplifier 1. It shows the effective duty cycle $a_{eff}$ as a function of the modulator duty cycle $a_{mod}$ and the filter capacitor voltage $u_{cfilt}$. The remaining value of $i_{filt}$ is zero. This table is used in the compensation block 5 to find the inverse function $a_{mod}=f(a_{eff},i_{filt},u_{cfilt})$ by the bisectional method. The table has a number of 41 supporting points in $a_{mod}$ direction, a number of 11 supporting points in $i_{filt}$ direction and a number of 21 supporting points in $u_{cfilt}$ direction. The supporting points in $i_{filt}$ and $u_{cfilt}$ direction are distributed semi logarithmically. $a_{mod}$ uses a linear distribution.

Figure 17:
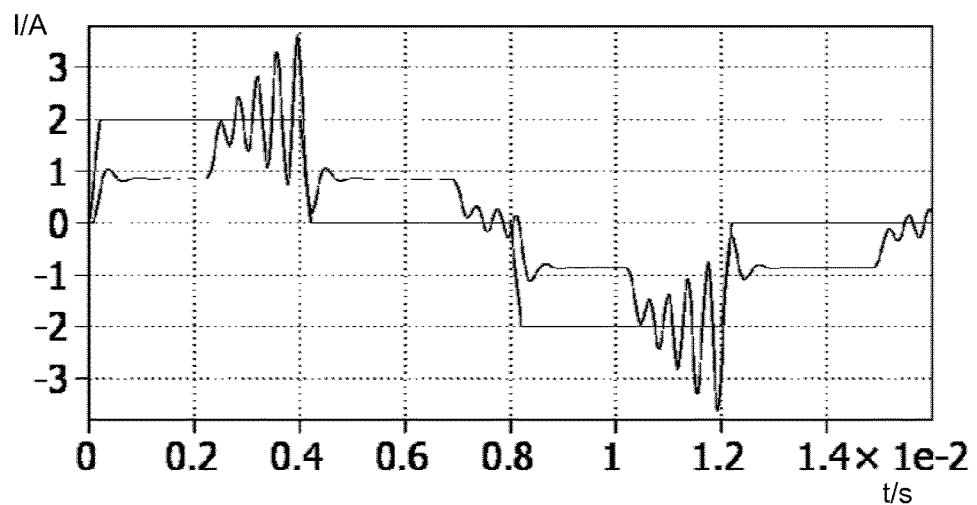
FIG. 17 shows a transient response for a gradient amplifier without non-linear compensation by a compensation block.
Figure 18:
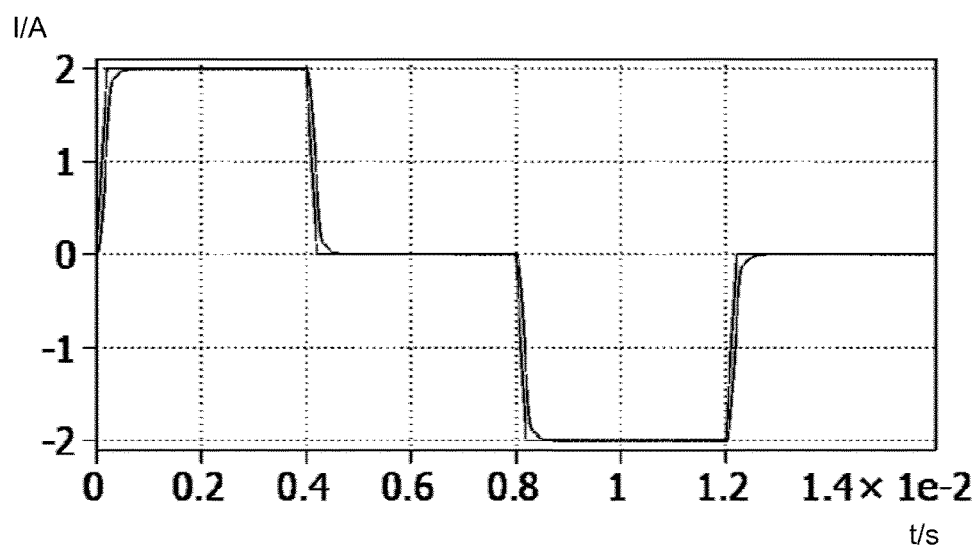
FIG. 18 shows a transient response for a gradient amplifier with non-linear compensation by a compensation block.

The advantages of this embodiment can be easily seen by comparing FIGS. 17 and 18. FIG. 17 shows a transient response for a gradient amplifier without compensation of the nonlinearities given by the dead-time and forward voltages. The controller is not stable, especially for small gradient currents the performance is far from being acceptable. By applying the above compensation to the system and using the bisection method to find the inverse function the transient response depicted below can be achieved.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A method for compensating non-linearities of a gradient amplifier for powering a gradient coil, the gradient amplifier comprising a controllable full bridge and an output filter, whereby the full bridge is controlled to provide a desired coil current, the method comprising:
   receiving a desired duty cycle of the gradient amplifier,
   measuring an input current and an output voltage of the output filter,
   evaluating a modulator duty cycle as a function of the desired duty cycle and the measured input current and the measured output voltage, and
   providing the modulator duty cycle to a modulator for controlling the full bridge, comprising:
      generating a three-dimensional look-up table, which provides the modulator duty cycle as a function of the desired duty cycle, the input current and the output voltage, including generating supporting points, which have a mixed logarithmically/linear distribution comprising generating a set of supporting points for positive values with a number of n logarithmically distributed main divisions and a number of $2^m$ linear subdivisions between each main division, where m is a set of bits following a most significant bit, and
   wherein the step of evaluating the modulator duty cycle comprises performing a look-up in the three-dimensional look-up table, the step of performing the look-up in the three-dimensional lookup-table comprises:
      determining an index value of the element in the three-dimensional look-up table by determining a logarithmic offset by evaluating a position of the most significant bit of the value to be looked-up and multiplying the position by $2^m$,
      taking the value of the set of m bits following the most significant bit as linear offset, and
      providing a sum of the logarithmic offset and the linear offset as index value.

2. The method according to claim 1, further comprising the step of generating an inverted three-dimensional look-up table, which provides the desired duty cycle as a function of the modulator duty cycle, the input current, and the output voltage, whereby the step of evaluating the modulator duty cycle further comprises performing a look-up of the desired duty cycle in the inverted three-dimensional lookup-table and determining the modulator duty cycle from the desired duty cycle according to the inverted three-dimensional look-up table.

3. The method according to claim 2, wherein the step of determining the modulator duty cycle from the desired duty cycle according to the inverted three-dimensional look-up table comprises approximating of the modulator duty cycle using a bisection method.

4. The method according to claim 1, wherein the step of evaluating the modulator duty cycle comprises performing an interpolation between supporting points of the three-dimensional look-up table.

5. The method according to claim 1, further including:
performing a linear interpolation between the supporting points of the three-dimensional look-up table, whereby a remainder following the set of m bits following the most significant bit defines the position of the value to be looked-up between adjacent supporting points.

6. The method according to claim 1, wherein the step of generating the three-dimensional look-up table comprises determining supporting points of the three-dimensional look-up table by simulation or by mathematical calculation.

7. A non-transitory computer-readable medium carrying a set of instructions that controls a computer to perform the method according to claim 1.

8. A method for compensating non-linearities of a gradient amplifier for powering a gradient coil, the gradient amplifier comprising a controllable full bridge and an output filter, whereby the full bridge is controlled to provide a desired coil current, the method comprising:
receiving a desired duty cycle of the gradient amplifier,
measuring an input current and an output voltage of the output filter,
evaluating a modulator duty cycle as a function of the desired duty cycle and the measured input current and the measured output voltage, and
providing the modulator duty cycle to a modulator for controlling the full bridge and comprising the step of generating a three-dimensional look-up table, which provides the modulator duty cycle as a function of the desired duty cycle, the input current and the output voltage, comprising generating supporting points, which have a mixed logarithmically/linear distribution comprising generating a set of supporting points equally distributed around zero with a number of 2n logarithmically distributed main divisions and a number of $2^m$ linear subdivisions between each main division, where m is a set of bits following a most significant bit, and wherein the step of evaluating the modulator duty cycle comprises performing a look-up in the three-dimensional look-up table, the step of performing the look-up in the three-dimensional lookup-table comprises:
determining an index value of the element in the three-dimensional look-up table by forming the absolute value of value to be looked-up,
determining a logarithmic offset by evaluating a position of the most significant bit of the absolute value and multiplying the position by $2^m$,
taking the value of the set of m bits following the most significant bit as linear offset, and
in case the value to be looked-up being a negative value, providing the half number of elements of the three-dimensional look-up table reduced by a sum of the logarithmic offset and the linear offset as index value, and otherwise providing a sum of a half number of elements of the three-dimensional look-up table, the logarithmic offset and the linear offset as index value.

9. A gradient amplifier for powering a gradient coil comprising:
at least two half bridges, each half bridge having at least two power switches connected in series;
an output filter having inputs connected to tapped center points of the half bridges, and outputs configured to be connected to a magnetic field gradient coil;
a compensation block configured to receive a desired duty cycle ($a_{eff}$), an input current ($i_{filt}$) received on the filter inputs, and a filter output voltage ($Uc_{filt}$) at the filter outputs, input the desired duty cycle ($a_{eff}$), the input current ($i_{filt}$) and the filter output voltage ($Uc_{filt}$) into a three-dimensional look-up table, and retrieve a modulator duty cycle ($a_{mod}$) from the three dimensional-look-up table; and
a modulator configured to control the power switches with the modulator duty cycle ($a_{mod}$) retrieved from the three-dimensional look-up table.

10. The gradient amplifier according to claim 9, wherein the power switch comprises a power transistor.

11. The gradient amplifier according to claim 10, wherein the power transistor includes a MOSFET or an IGBT connected in parallel with a diode.

* * * * *